(12) United States Patent
Sanders et al.

(10) Patent No.: US 6,404,080 B1
(45) Date of Patent: Jun. 11, 2002

(54) ELECTRONIC MEANS TO SENSE ACTUATION OF AC OUTPUT CONTROL CIRCUITRY

(75) Inventors: S. Todd Sanders, Freeport; David R. Mc Collum, Cedarville, both of IL (US)

(73) Assignee: Honeywell INC, Morristown, NJ (US)

( * ) Notice: Subject to any disclaimer, the term of this patent is extended or adjusted under 35 U.S.C. 154(b) by 0 days.

(21) Appl. No.: 09/323,494

(22) Filed: Jun. 1, 1999

(51) Int. Cl.[7] ............................................... H01H 47/00
(52) U.S. Cl. ..................... 307/125; 307/112; 307/131; 340/644; 361/91
(58) Field of Search ................................ 307/125, 143, 307/115, 144, 130, 131, 112; 361/91; 340/641, 644, 653, 654; 327/447, 465, 514

(56) References Cited

U.S. PATENT DOCUMENTS

| | | | | |
|---|---|---|---|---|
| 3,940,634 A | * | 2/1976 | Grogan | 327/451 |
| 4,250,501 A | * | 2/1981 | Pokrandt | 340/664 |
| 4,376,277 A | | 3/1983 | Black, Jr. | |
| 4,649,302 A | | 3/1987 | Damiano et al. | |
| 5,128,657 A | * | 7/1992 | Girard | 340/654 |
| 5,146,386 A | * | 8/1992 | Learned | 361/91.4 |
| 5,455,733 A | * | 10/1995 | Waggamon | 361/115 |
| 4,670,810 A | | 6/1997 | Valeur | |
| 5,925,888 A | * | 7/1999 | Pecore | 250/551 |

FOREIGN PATENT DOCUMENTS

| | | |
|---|---|---|
| DE | 0 285 814 A1 | 3/1988 |
| EP | 0 540 033 A1 | 10/1992 |
| FR | 2 747 864 | 4/1996 |

OTHER PUBLICATIONS

PCT International Searcgh Report, Oct. 15, 2000, International Application No. PCT/US 00/14972.

Toshiba 4N25, 4N25A, 4N27, 4N28 (SHORT), technical specification, XP-oo2146850, Feb. 27, 1998, pp. 1–6, BNS-DOCID: <XP_2146850A_1_>.

* cited by examiner

*Primary Examiner*—Josie Ballato
*Assistant Examiner*—Robert L Deberadinis
(74) *Attorney, Agent, or Firm*—Roland W. Norris; Snell & Wilmer; Andrew Abeyta

(57) ABSTRACT

A circuit placed between an alternating current actuated device and a digital logic controller to isolate the digital logic controller from the AC line power and to provide a signal indicative of actuation of the alternating current device.

19 Claims, 1 Drawing Sheet

ELECTRONIC MEANS TO SENSE ACTUATION OF AC OUTPUT CONTROL CIRCUITRY

BACKGROUND OF THE INVENTION

1. Field of the Invention

The present invention relates generally to means for isolating an alternating current (AC) actuated device from a logic control device integrated therewith, combined with means for detecting when the AC actuated device is operational.

2. Description of the Related Art

Many AC devices which perform work are now controlled by digital logic devices such as microcontrollers, microprocessors, or programmable logic controllers (PLCs). Examples of this in the consumer field include numerous household appliances. In the industrial field, a common example would be in material handling operations where various sensors, motors, relays, solenoids, et al. are required to run the conveying and handling apparatus and may be controlled by one or more bus systems, programmable logic controllers, or on board microprocessors. In this instance, it is often critical that immediate detection of a fault condition in an actuated device is available to the operator in order to prevent mishandling, backups, crashes, etc; of the items on the conveyor line.

Further, because digital logic control is incompatible with the AC power required for the actuated devices, isolation between DC logic power and AC device power is highly desirable.

It is further highly desirable that an actuation sensor be accomplished inexpensively and reliably within a small package which can easily be added to or integrated within existing systems.

SUMMARY OF THE INVENTION

The present invention provides a means for isolating an AC actuated device and detecting its actuation via a digital controller which controls the actuation. The means generally comprises a circuit having an optocoupler or other suitable means for isolating an AC actuated device, or load, from a DC microcontroller or PLC; a diode network allowing current flow in first and second directions and for biassing the light emitter of the optocoupler; a device actuation switch between the device and the diode network which is controlled by the PLC and; resistor-capacitor (RC) RC charge and discharge paths connected between the phototransistor output of the optocoupler and the PLC to vary the state of an indicator output connection which the PLC can sense to determine that the load is present, i.e. the device is actuated when the device actuation switch is placed in the ON state.

The invention may further comprise suitable biassing and limiting resistors, connection points, DC power supplies and the like as necessary or desirable.

BRIEF DESCRIPTION OF THE DRAWINGS

The present invention will be more fully and completely understood from a reading of the Description of the Preferred Embodiment in conjunction with the drawings, in which.

DESCRIPTION OF THE PREFERRED EMBODIMENT

Figure 1:
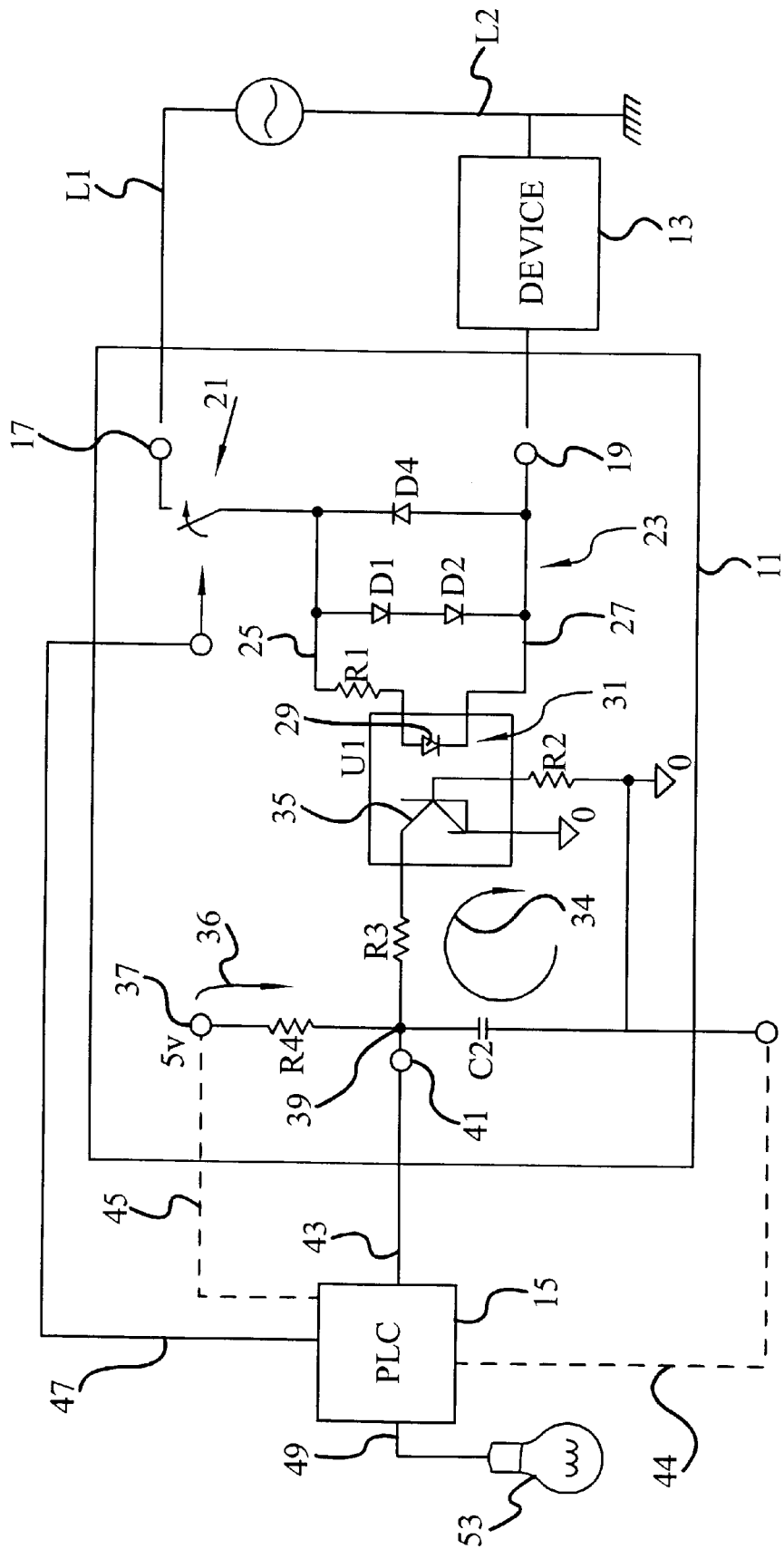
FIG. 1 is schematic of the present invention in situ between a PLC and an AC actuated device.

Throughout the Description of the Preferred Embodiment, like components will be identified by like reference numerals.

As seen in FIG. 1, the electronic circuit 11 of the present invention is used to sense the actuation of an AC powered device 13 through a DC powered programmable logic controller (PLC) 15. The device 13 acts as the AC load upon the circuit 11. While described as a PLC, the DC powered logic and control circuit may be a microcontroller, microprocessor, ASIC, or the like. The device 13 is powered by AC power lines L1 and L2 and connected to the circuit 11 through first and second AC connectors 17, 19, respectively, of any known type.

The circuit 11 contains an electronic or electromechanical controllable switch 21 controlling current flow through the first AC connector 17. The AC actuated device 13 is placed between second AC line L2 and second AC connector 19. It will be appreciated that the device may be placed in series with the first AC line L1, if desired. Between the pole side of switch 21 and the device 13 are connected a diode network 23 having a first line of two series diodes, D1, D2 in parallel with a single second line having a reverse direction diode D4. A first leg 25 of the diode network 23 has a current limiting first resistor R1 in parallel with series diodes D1, D2 and connected to the anode 29 of the light emitter, or LED 31, of an optocoupler U1. The second leg 27 of the diode network is connected to the cathode of the LED 31. The optocoupler U1 is used to isolate the AC power lines L1 and L2 of the device 13 from the DC powered half of the circuit 11 and its attendant PLC 15. The optocoupler U1 includes a phototransistor 35 in its internal circuitry as is common in the art. The optocoupler may be comprised of discrete components if desired.

The base of phototransistor 35 is connected through a second resistor R2 to ground. The specific values and types of the electronic components will be recognized as variable according to the specific application selected by the ordinarily skilled artisan. A first side of a capacitor C2 is connected to the collector of phototransistor 35 through a third resistor R3 thereby forming an RC discharge path through the phototransistor 35 to ground, as illustrated by line 34. A fourth resistor R4 is connected between the DC power supply 37 and the junction 39 of capacitor C2 and the third resistor R3 to form an RC charge path, as illustrated by line 36. Extending from the junction 39 is an indicator connection 41 to which is attached a sense pin 43 of the PLC 15 for the purpose of monitoring the voltage state of the indicator connection 41. The emitter of the phototransistor 35 is connected to ground. The DC power supply 37 may be shared with the PLC 15 as indicated by the dashed line 45. The PLC 15 also shares a ground with the DC side of the circuit as indicated by dashed line 44.

The PLC 15 is connected through a second, or control, pin 47 to the controllable switch 21 whereby it controls activation of the device 13. Suitable isolation between the AC and DC halves of the circuit is maintained by, e.g., relay operation or optocoupling (not shown) of the switch control function.

Activation of the device 13 by closing of the controllable switch 21 places a load on, i.e., causes current to flow through, the circuit 11 causing voltage to rise across the series diodes D1, D2 during the positive half of the AC line cycle. When this voltage is sufficient, the LED 31 of the optocoupler U1 turns on. Damage to the LED 31 is prevented by current limiting resistor R1. The phototransistor 35 then conducts causing the capacitor C2 to discharge through the phototransistor 35, making the voltage level at indicator connection 41 a logical low. The charge and discharge time constants determined by the values of R4 and R3, respectively, can be sized to provide a slow charge time and rapid discharge time to facilitate detection of the low voltage state at indicator connection 41 in order to accommodate the polling duty cycle of the sensing algorithm of PLC 15 through pin 43. When the PLC knows the controllable switch 21 has been activated and it then senses a low voltage at the indicator connection 41 it can decide that the device 13 is present and active. It can then report through its output "report pin" 49 the operative state of the device 13 to, for example, an operator interface indicator bulb 53.

If a square wave corresponding to the half line cycles were desired at indicator connection 41 and the PLC sensing algorithm/duty cycle were adjusted accordingly, very fast sensing response may be obtained without the use of R3 and C2 to form a discharge path.

While the present invention has been shown and described with reference to preferred embodiments, many alternatives will become apparent to the ordinarily skilled artisan upon disclosure of the present invention. Therefore the present invention is only to be limited by the claims appended hereto.

Having thus described the invention what is claimed is:

1. A circuit for isolating and indicating actuation of AC powered-device, comprising:
   a) an AC side having:
      i.) AC power and device connections
      ii.) a switch for connecting AC power to the circuit, the switch connectable to a DC controller for control thereof;
      iii.) a first direction diode for allowing substantial device current flow in a first half of an AC line cycle, the first direction diode providing breakover voltage for an LED of an optocoupler;
   b) an optocoupler having an LED and a phototransistor and having its LED connected across the AC side in parallel with the first direction diode; and
   c) a DC side having;
      i.) a resistor connected between the DC power source and the phototransistor collector,
      ii.) an indicator connection connected between the resistor and the phototransistor and connectable to a DC controller; whereby when the device is actuated, indication of the actuation of the device at the indication connection is provided.

2. The circuit of claim 1 further comprising:
a second direction diode in reverse parallel connection with the first direction diode for allowing current flow in a second half of an AC line cycle.

3. The circuit of claim 1 wherein the first direction diode further comprises:
two diodes in series.

4. The circuit of claim 1 further comprising:
a current limiting resistor for the LED of the optocoupler.

5. The circuit of claim 1 further comprising:
an RC charge path connected to the phototransistor collector, the charge path including the resistor connected between the DC power connection and the phototransistor and a first capacitor connected between the resistor and ground.

6. The circuit of claim 5 further comprising:
an RC discharge path through the phototransistor collector, the discharge path including the first capacitor and a second resistor connected between the DC power connection.

7. The circuit of claim 6 further comprising:
an indicator point at the junction of the RC charge path and RC discharge path connectable to a digital logic control circuit.

8. The circuit of claim 1 further comprising:
a digital DC controller connected to indicator connection and the controllable switch for sensing the state of the indicator connection and controlling the controllable switch.

9. The circuit of claim 1 further comprising:
a biasing resistor connected to the phototransistor base.

10. The circuit of claim 1 further comprising:
an AC actuated device connected to the AC device connections and serving as a load for the circuit.

11. The circuit of claim 1 wherein the indicator connection is connected between the resistor and the phototransistor collector.

12. A circuit for isolating and sensing actuation of an AC powered device, comprising:
   a.) an AC side having:
      i.) AC power and device connections
      ii.) a controllable switch;
      iii.) a diode network having first direction diodes and second direction diodes in reverse parallel connection for allowing substantial device current flow in first and second halves of an AC line cycle, respectively, the first direction diodes providing breakover voltage for an LED of an optocoupler
      iv.) a current limiting resistor for the LED of an optocoupler;
      v.) an optocoupler having an LED and a phototransistor and having its LED connected across the AC side in parallel with the first and second direction diodes;
   b.) a DC side having:
      i.) DC power and device connections;
      ii.) a first RC network serving as a charge path, the junction between the resistor and capacitor of the first RC network being connected to the phototransistor collector;
      iii.) a second RC network serving as a discharge path connected in series to the phototransistor collector;
      iv.) an indicator connection connected at the junction of the RC charge and discharge paths;
      v.) a biasing resistor for the phototransistor base;
      vi.) the phototransistor emitter tied to ground; and
      vii.) a digital DC controller for sensing the state of the indicator connection and controlling the controllable switch;
   whereby when the device is actuated, the optocoupler turns on discharging the second RC network providing indication of the actuation of the device at an indication connection which the digital controller may compare switch state and indicator connection state to interpret proper operation of the device.

13. The circuit according to claim 12 wherein the resistor of the second RC network is placed between the phototransistor collector and the charge path of the first RC network.

14. The circuit according to claim 12 further including an AC actuated device connected to the controllable switch.

15. The circuit according to claim 14 further including the digital controller having an operator interface for reporting the actuation state of the AC actuated device.

16. An AC device actuation sense circuit comprising:
   a.) an AC actuated device;
   b.) an AC line switch for controlling power to the device; the line switch being placed between the device and an optocoupler;
   c.) a digital logic controller for controlling the AC line switch;
   d.) an optocoupler having a light emitter and phototransistor for power isolation;

e.) first and second diodes in parallel with the light emitter for controlling voltage to the LED and allowing substantial device current flow during a first half of the AC line cycle;

f.) a resistor for current control to the LED;

g.) a diode reversed in direction from the first and second diodes and in parallel therewith for allowing current flow during a second half of the AC line cycle;

h.) an RC charge path connected to the collector of the phototransistor;

i.) an RC discharge path connected to the collector of the phototransistor;

j.) an indicator output connection connected to the RC charge and discharge paths for connection to a pin of the digital logic controller for sensing and interpreting the voltage state of the output connection;

k.) a DC power connection for the phototransistor; and l.) a pull down resistor for biasing the base of the phototransistor.

17. The circuit according to claim 16 wherein:

the digital logic controller is further connected to an operator interface indication means.

18. The circuit of claim 17 wherein:

the resistor of the RC discharge path is between the junction of the resistor and capacitor of the RC charge path and the collector of the phototransistor.

19. The circuit of claim 16 wherein:

the junction of the resistor and capacitor of the RC charge path is connected to the collector of the phototransistor.

* * * * *